(12) United States Patent
Youn

(10) Patent No.: US 8,247,304 B2
(45) Date of Patent: Aug. 21, 2012

(54) METHOD OF MANUFACTURING SEMICONDUCTOR DEVICE HAVING CAPACITOR UNDER BIT LINE STRUCTURE

(75) Inventor: Kwan-young Youn, Seoul (KR)

(73) Assignee: Samsung Electronics Co., Ltd. (KR)

( * ) Notice: Subject to any disclaimer, the term of this patent is extended or adjusted under 35 U.S.C. 154(b) by 375 days.

(21) Appl. No.: 12/592,396

(22) Filed: Nov. 24, 2009

(65) Prior Publication Data
US 2010/0221889 A1    Sep. 2, 2010

(30) Foreign Application Priority Data
Feb. 27, 2009   (KR) .................. 10-2009-0017155

(51) Int. Cl.
*H01L 21/20* (2006.01)
(52) U.S. Cl. ........ 438/386; 438/243; 438/244; 438/253; 438/387
(58) Field of Classification Search .................. 438/243, 438/244, 253, 386, 387
See application file for complete search history.

(56) References Cited

U.S. PATENT DOCUMENTS

| | | | |
|---|---|---|---|
| 7,375,389 | B2 | 5/2008 | Oh et al. |
| 2002/0182798 | A1* | 12/2002 | Saito et al. ............... 438/211 |
| 2003/0215997 | A1* | 11/2003 | Hachisuka et al. ........ 438/241 |
| 2004/0173836 | A1 | 9/2004 | Oh et al. |
| 2005/0186743 | A1* | 8/2005 | Utsunomiya ............. 438/286 |
| 2006/0131632 | A1* | 6/2006 | Chae ........................ 257/300 |

FOREIGN PATENT DOCUMENTS

| | | |
|---|---|---|
| JP | 2005-5337 A | 1/2005 |
| KR | 10-2005-0031524 A | 4/2005 |
| KR | 10-0527668 B1 | 11/2005 |

* cited by examiner

*Primary Examiner* — Jae Lee
(74) *Attorney, Agent, or Firm* — Onello & Mello, LLP

(57) ABSTRACT

Provided is a method of manufacturing a semiconductor device having a capacitor under bit line (CUB) structure capable of increasing a gap between a bit line in a cell area and an upper plate of a capacitor, reducing coupling capacitance therebetween, and forming deep contacts in a logic area. A capacitor including a lower electrode, a dielectric material layer, and an upper electrode is formed in an opening of a first insulating layer for exposing a first part of a semiconductor substrate in a cell area. A second insulating layer is formed on the first insulating layer. The first and second insulating layers are etched. First and second contact plugs are formed in first and second contact holes for exposing second and third parts in the cell area and the logic area. A third insulating layer including first through third conductive studs is formed on the second insulating layer. A fourth insulating layer including a bit line and first and second wires contacted with the first through third conductive studs is formed.

10 Claims, 13 Drawing Sheets

METHOD OF MANUFACTURING SEMICONDUCTOR DEVICE HAVING CAPACITOR UNDER BIT LINE STRUCTURE

CROSS-REFERENCE TO RELATED APPLICATION

This application claims the benefit of Korean Patent Application No. 10-2009-0017155, filed on Feb. 27, 2009, in the Korean Intellectual Property Office, the entire contents of which are incorporated herein by reference.

BACKGROUND

The inventive concept relates to a method of manufacturing a semiconductor device, and more particularly, to a method of manufacturing a semiconductor device having a capacitor under bit line (CUB) structure.

Embedded semiconductor devices, in which products having various structures are integrated, are widely being employed. The embedded semiconductor device can include a memory device and a logic device that are integrated in one chip and that are formed of a cell array area and a logic circuit area, respectively. A plurality of memory cells is arranged in the cell array area and information stored in the cell array area is generated as new information by a logic circuit.

A memory device included in an embedded semiconductor device may be a dynamic random access memory (DRAM) or a static random access memory (SRAM). A capacitor of a DRAM may have a CUB structure that is formed before a bit line is formed or may have a capacitor over bit line (COB) structure that is formed after a bit line is formed. A process for fabricating a capacitor having a CUB structure is simpler than that of a capacitor having a COB structure, such that a capacitor having a CUB structure is more commonly used in an embedded semiconductor device.

In a CUB structure, the upper electrode of the capacitor can be in close proximity to a bit line. In order to prevent coupling capacitance between the upper electrode of the capacitor and the bit line, the thickness of an insulating layer interposed between the upper electrode and the bit line may be greater than or equal to a predetermined thickness. However, the thickness of the insulating layer in the logic area is relatively great and thus the depth of deep contact holes is increased, thereby creating a difficulty in forming of the deep contact holes.

SUMMARY

The inventive concept provides a method of manufacturing a semiconductor device having a capacitor under bit line (CUB) structure capable of forming deep contact holes and reducing coupling capacitance between the bit line and an upper electrode of the capacitor.

According to an aspect of the inventive concept, there is provided a method of manufacturing a semiconductor device having a capacitor under bit line (CUB) structure. A first insulating layer may be formed on a semiconductor substrate having a cell area and a logic area, the first insulating layer comprising an opening for exposing a first part of the semiconductor substrate in the cell area. A capacitor including a lower electrode disposed in the opening and contacted with the exposed first part, a dielectric layer disposed on the lower electrode and the first insulating layer in the cell area, and an upper electrode disposed on the dielectric material layer may be formed. A second insulating layer may be formed on the capacitor and the first insulating layer. The first and second insulating layers may be etched to form a first contact hole for exposing a second part of the substrate in the cell area and to form a second contact hole for exposing a third part of the substrate in the logic area. First and second contact plugs contacted with the exposed second and third parts of the semiconductor substrate may be formed in the first and second contact holes, respectively. A third insulating layer may be formed on the first and second contact plugs, the capacitor, and the second insulting layer. First through third conductive studs contacted with the first through second contact plugs and a part of the upper electrode in the capacitor may be arranged in the third insulating layer. A fourth insulating layer may be formed on the first through third conductive studs and the third insulating layer. A bit line contacted with the first conductive stud, and first and second wires contacted with the second and third conductive studs may be arranged in the fourth insulating layer.

In one embodiment, the forming of the first through third conductive studs may include: etching the third insulating layer to form first and second trenches for exposing the first and second contact plugs, and to form a third trench for exposing the part of the upper electrode in the capacitor; and forming Cu studs in the first through third trenches using a damascene process.

In one embodiment, the forming of the fourth insulating, wherein the bit line and the first and second wires are disposed, may include: forming a lower interlayer insulating layer on the first through third conductive studs and the third insulating layer; forming an upper interlayer insulating layer on the lower interlayer insulating layer; etching the lower and upper interlayer insulating layers to form via holes for exposing parts of the first through third conductive studs; etching the upper interlayer insulating layer to form trenches for exposing the via holes; and forming the bit line and the first and second wires disposed in the via holes and the trenches and contacted with the first through third conductive studs using a dual damascene process.

In one embodiment, the forming of the capacitor may include: forming the lower electrode in the opening; forming the dielectric material layer on the lower electrode and the first insulating layer; forming an upper electrode layer on the dielectric material layer; and etching the upper electrode layer and the dielectric material layer to form the dielectric layer and the upper electrode having a window. The forming of the capacitor may further include forming an etching stop layer on the upper electrode layer, wherein the window is formed throughout the etching stop layer, the upper electrode, and the dielectric material layer.

The etching of the first and second insulating layers may further include etching a part of the etching stop layer to form a third contact hole for exposing the part of the upper electrode and the forming of the first and second contact plugs further comprises forming a third contact plug in the third contact hole for contacting the part of the upper electrode in the capacitor with the third conductive stud.

The forming of the second insulating layer may include: forming a lower interlayer insulating layer on the capacitor and the first insulating layer; etching the lower interlayer insulating layer until the etching stop layer is exposed to be planarized; and forming an upper interlayer insulating layer on the lower interlayer insulating layer. The lower interlayer insulating layer may be buried within the window in the cell area and the lower interlayer insulating layer may be formed on the entire surface of the logic area. In one embodiment, the capacitor may include a metal-insulator metal (MIM) capacitor.

According to another aspect, the inventive concept is directed to a method of manufacturing a semiconductor device having a capacitor under bit line (CUB) structure, the method comprising: forming a first transistor on a cell area of a semiconductor substrate, the first transistor comprising a first gate and first impurity regions formed on both sides of the first gate, and a second transistor on a logic area of the semiconductor substrate, the second transistor comprising a second gate and second impurity regions formed on both sides of the second gate; forming a first insulating layer on the semiconductor substrate and the first and second transistors, wherein first contact plugs for exposing parts of the first impurity regions and a second contact plug for exposing one of the second impurity regions are disposed in the first insulating layer; forming a second insulating layer on the first and second contact plugs and the first insulating layer, the second insulating layer comprising an opening for exposing one of the first contact plugs; forming a capacitor comprising a lower electrode disposed in the opening and contacted with the exposed first contact plug, a dielectric layer, and an upper electrode formed on the lower electrode and the second insulating layer in the cell area; forming a third insulating layer on the second insulating layer and the capacitor and removing a step difference between the cell area and the logic area; etching the second and third insulating layers to form a first contact hole for exposing another one of the first contact plugs in the cell area and to form a second contact hole for exposing the second contact plug in the logic area; forming third and fourth contact plugs contacted with the exposed first and second contact plugs in the first and second contact holes; forming a fourth insulating layer on the first and second contact plugs, the capacitor, and the second insulating layer, wherein first through third conductive studs contacted with the first and second contact plugs and a part of the upper electrode in the capacitor are disposed in the fourth insulating layer; forming a fifth insulating layer on the first through third conductive studs and the fourth insulating layer; etching the fifth insulating layer to form first through third dual damascene patterns for exposing the first through third conductive studs; and forming a bit line and first and second wires contacted with the first through third conductive studs in the first through third dual damascene patterns.

BRIEF DESCRIPTION OF THE DRAWINGS

The foregoing and other features and advantages of the inventive concept will be apparent from the more particular description of preferred aspects of the inventive concept, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF THE EMBODIMENTS

Figure 1:
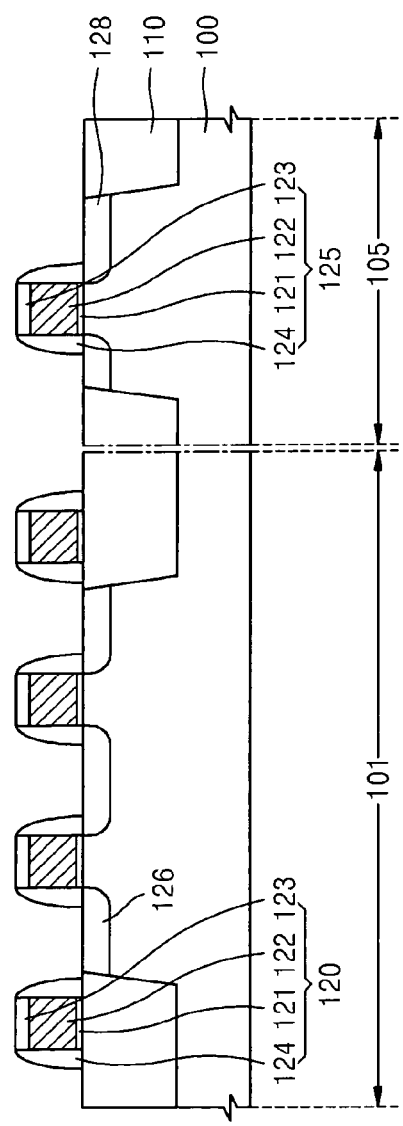
FIGS. 1 through 5 are cross-sectional views illustrating a method of manufacturing a semiconductor device according to an embodiment of the inventive concept.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this description will be thorough and complete, and will fully convey the inventive concept to those skilled in the art. In the drawings, the forms of elements are exaggerated for clarity. Like reference numerals in the drawings denote like elements.

Figure 3:
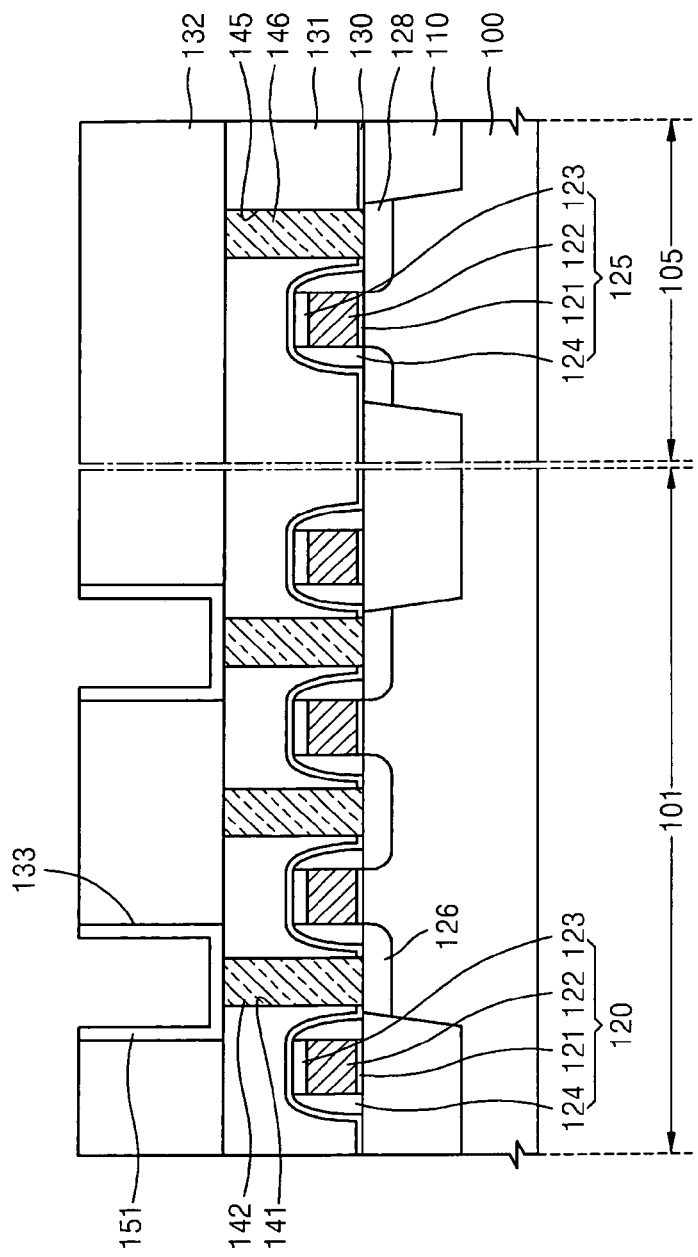
Figure 4:
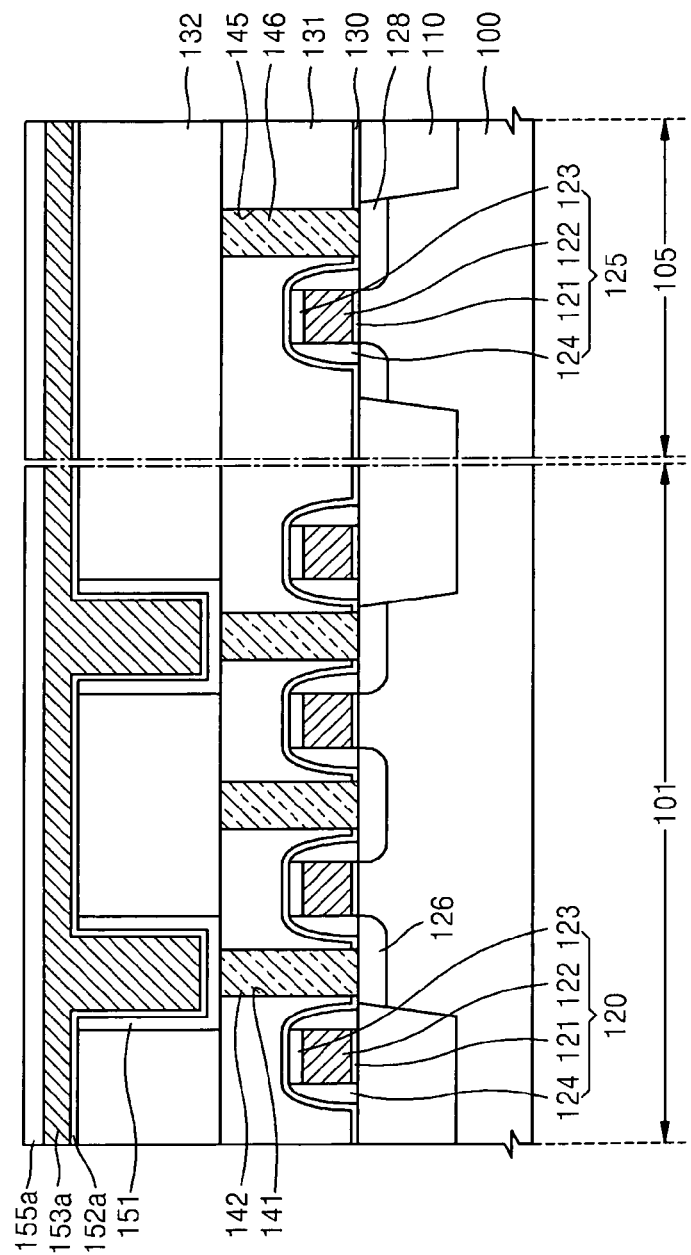
Figure 5:
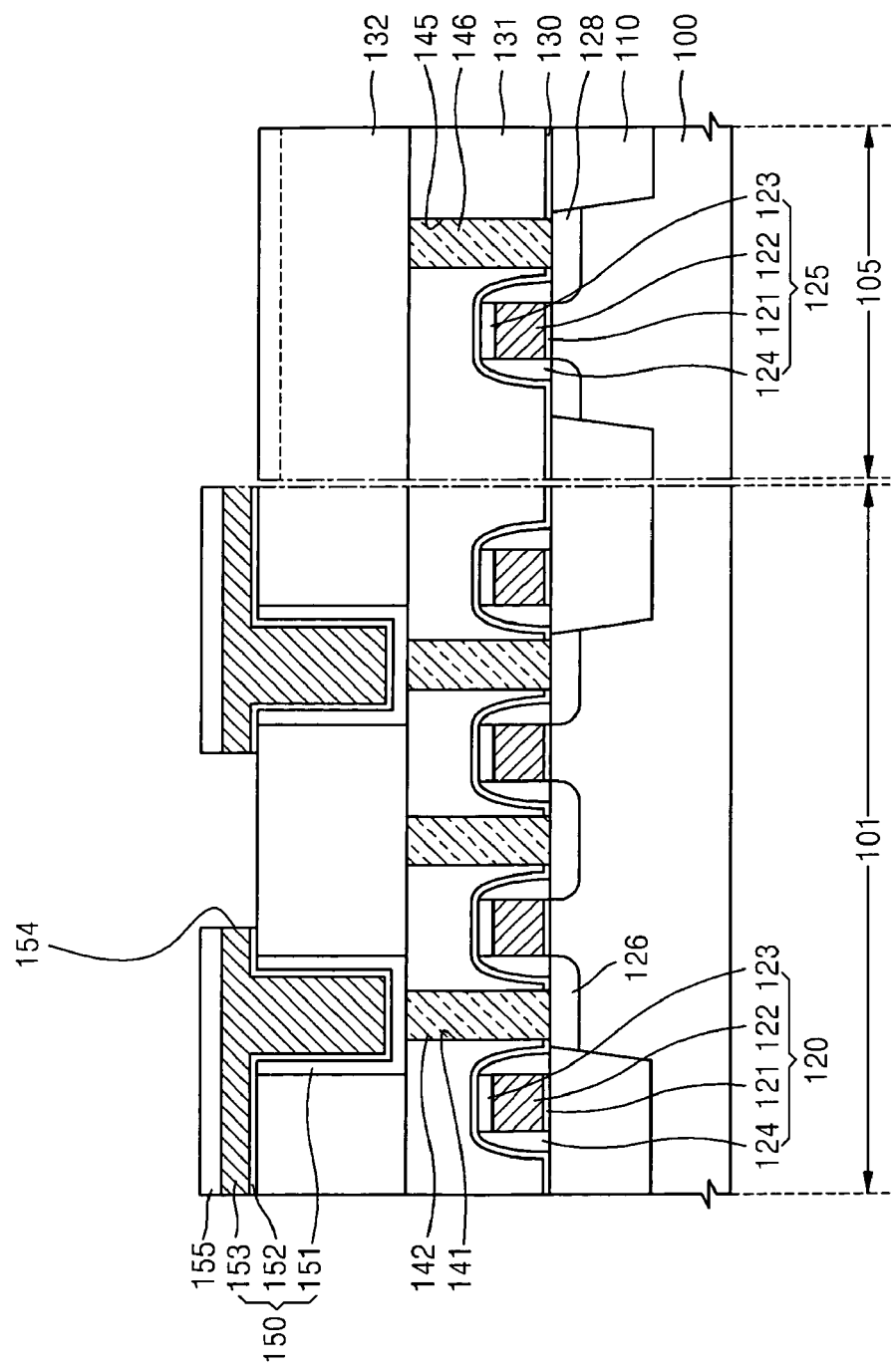
Figure 6:
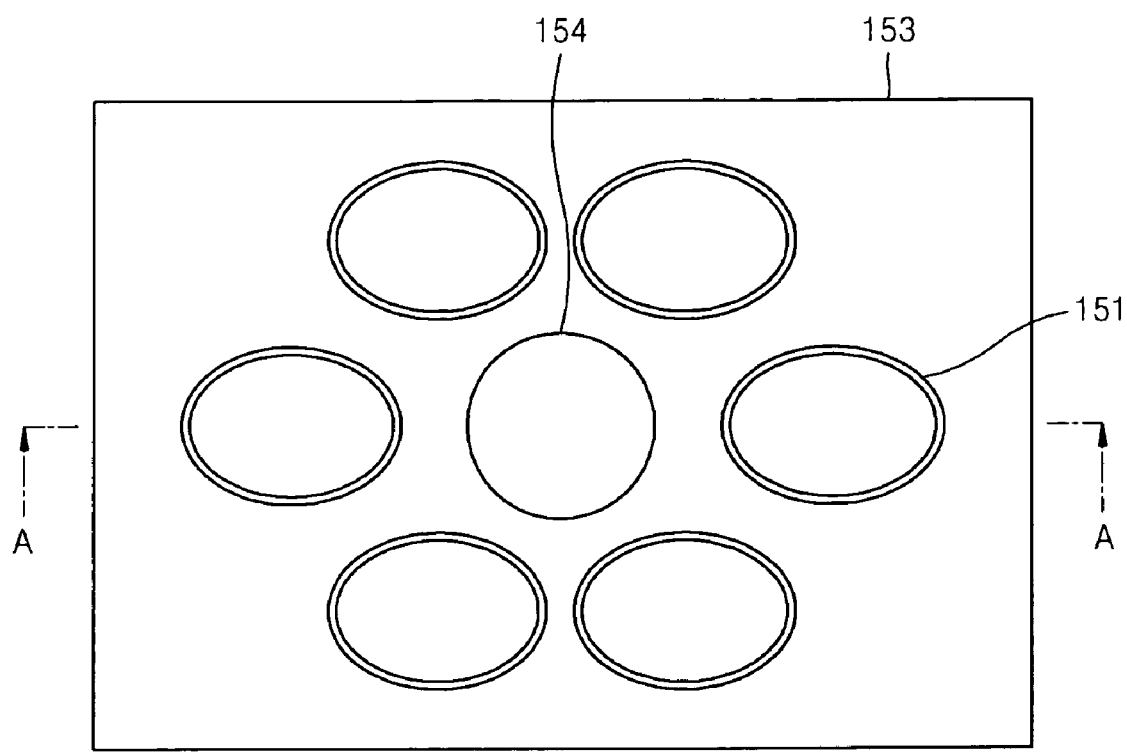
FIG. 6 is a plan view of the semiconductor device of FIG. 5 for illustrating a method of manufacturing the semiconductor device according to an embodiment of the inventive concept.
Figure 7:
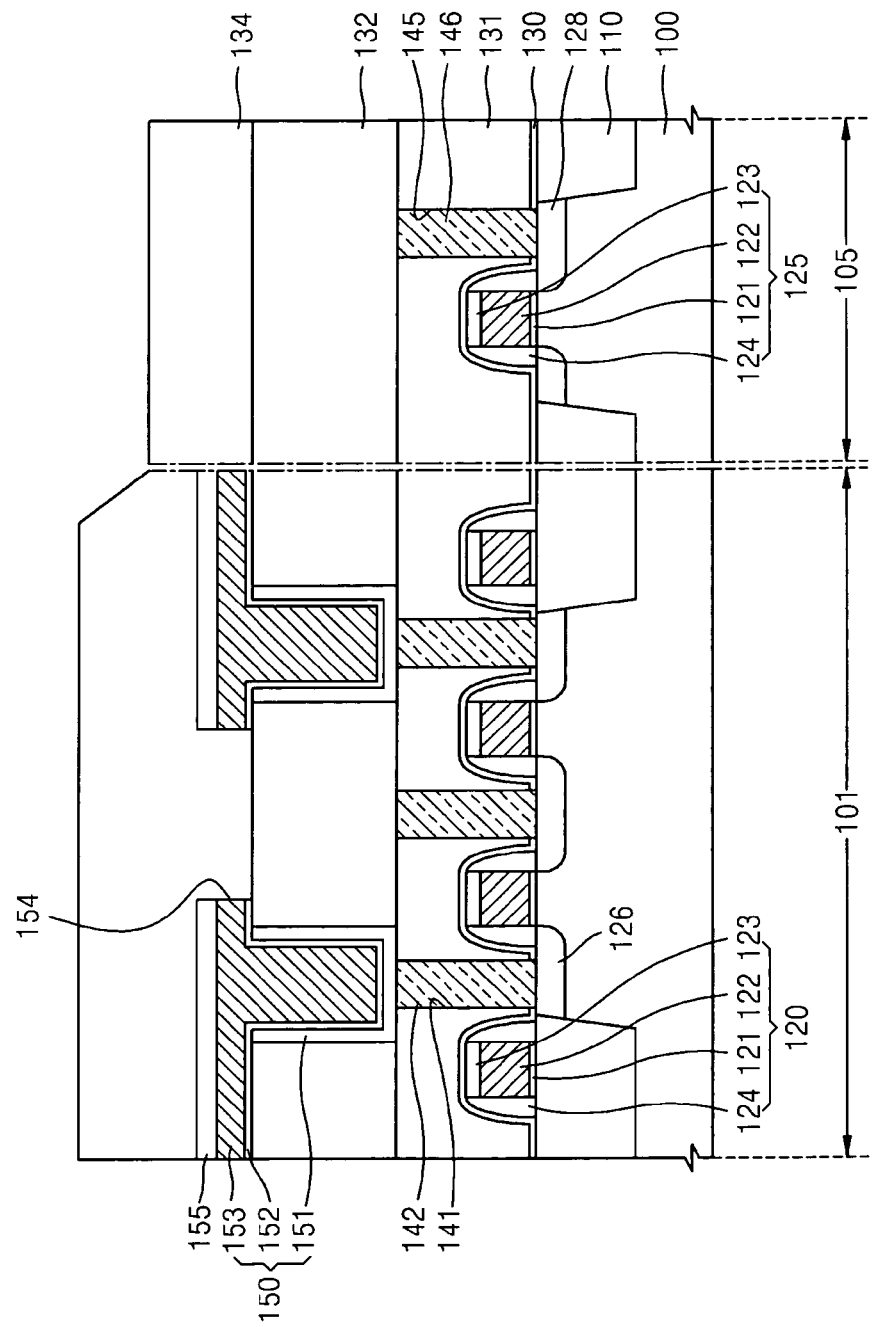
FIGS. 7 through 9 are cross-sectional views illustrating a method of manufacturing a semiconductor device according to an embodiment of the inventive concept.
Figure 8:
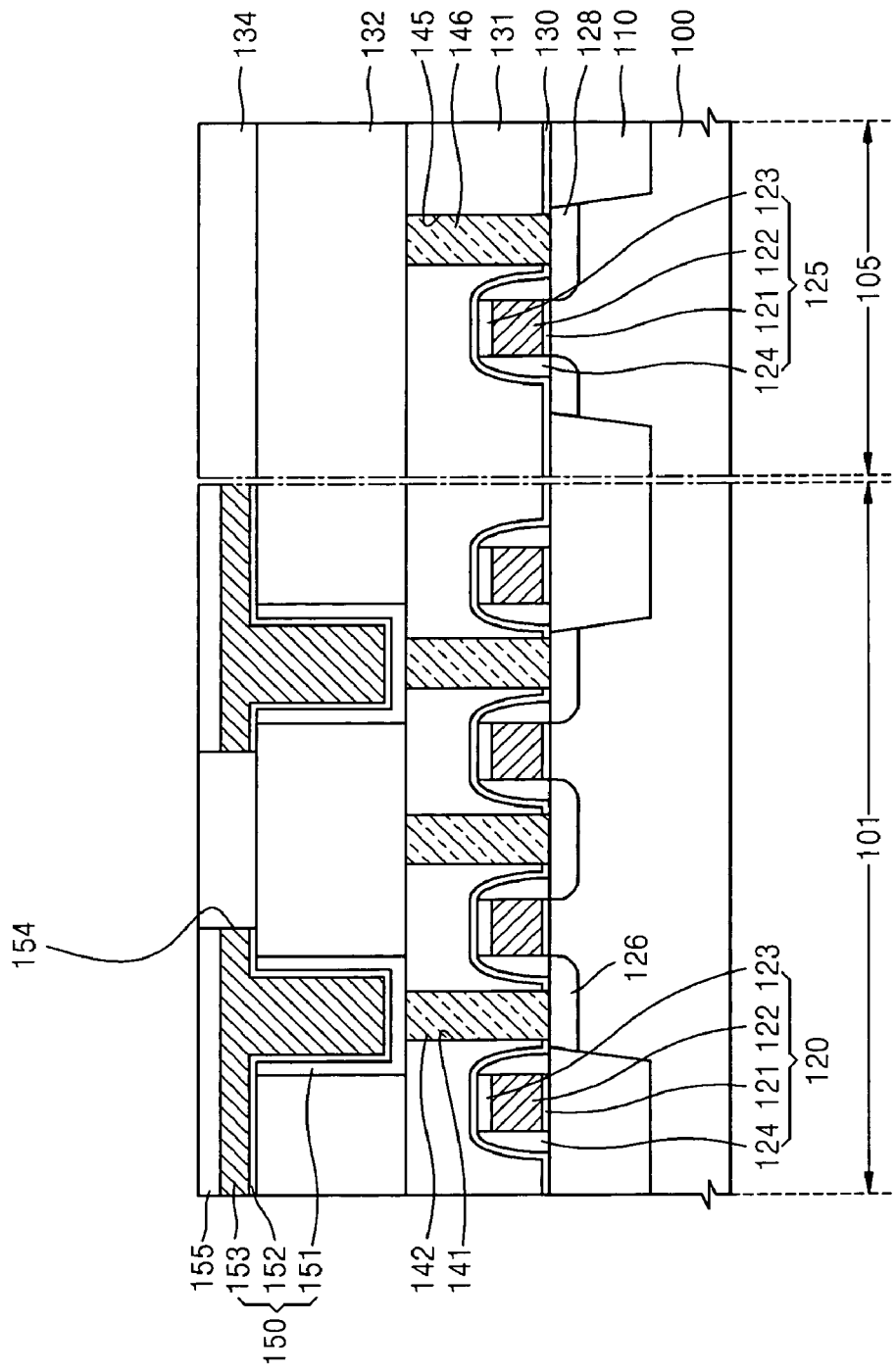
Figure 9:
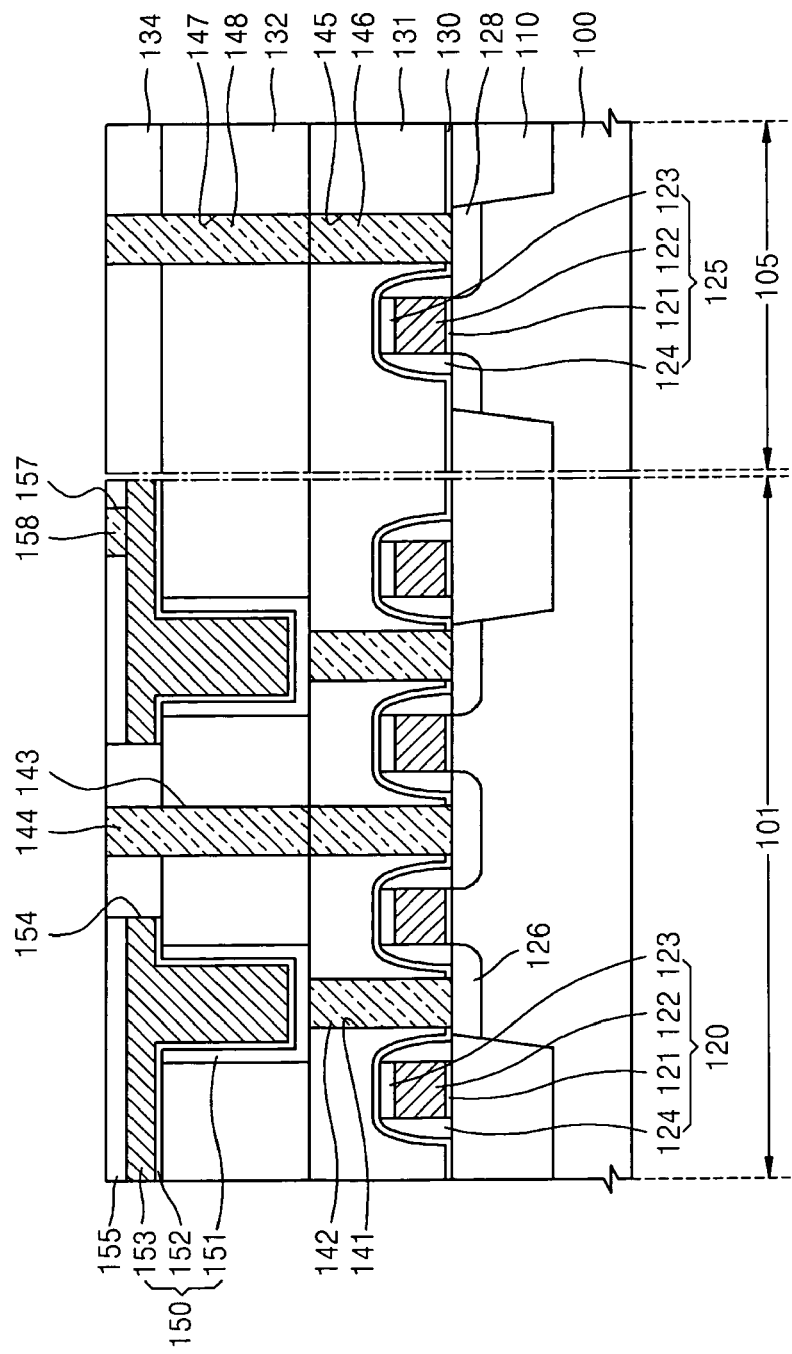
Figure 10:
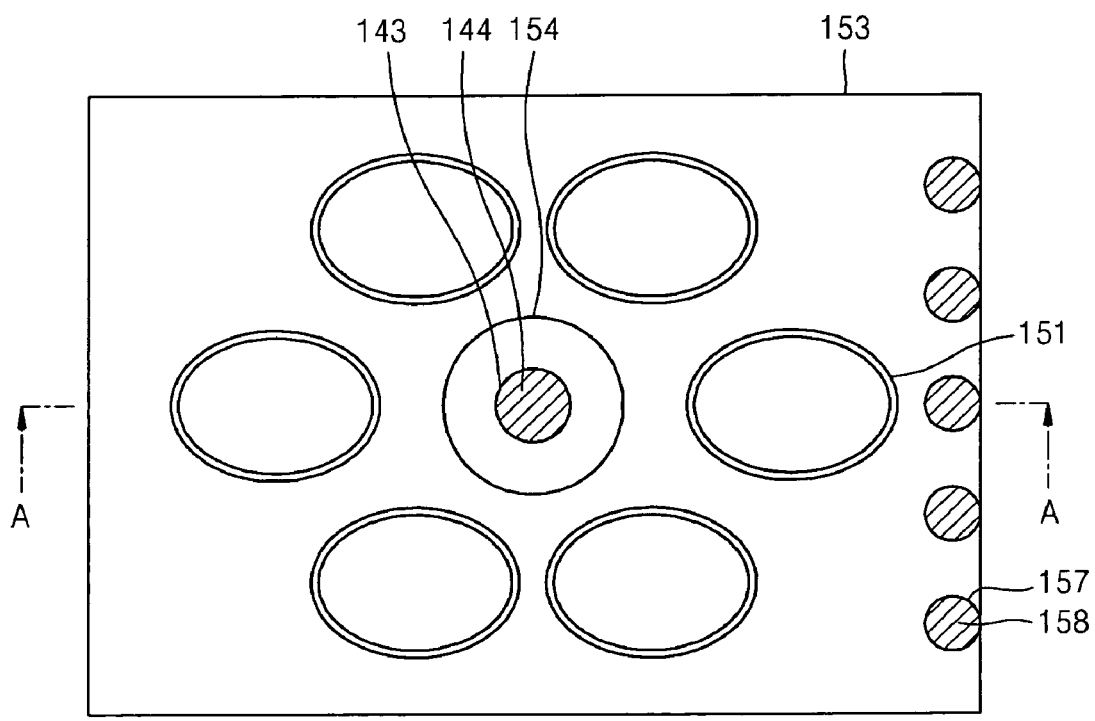
FIG. 10 is a plan view of the semiconductor device of FIG. 9 for illustrating a method of manufacturing the semiconductor device according to an embodiment of the inventive concept.

FIGS. 1 through 5, 7 through 9, and 11 through 13 are cross-sectional views illustrating a method of manufacturing a semiconductor device according to an embodiment of the inventive concept, FIGS. 6 and 10 are plan views of the semiconductor devices of FIG. 5 and FIG. 9, respectively, for illustrating a method of manufacturing the semiconductor devices according to an embodiment of the inventive concept, and FIGS. 5 and 9 are cross-sectional views of the semiconductor devices cut along the line A-A of FIGS. 6 and 10, respectively.

Referring to FIG. 1, a semiconductor substrate 100 may include a cell area 101 and a logic area 105. The cell area 101 may include a cell array area on which a plurality of memory cells is arranged. The logic area 105 may include a core area, a peripheral circuit area and/or a logic area. The semiconductor substrate 100 includes a device isolation layer 110 defining active regions of the cell area 101 and the logic area 105. The device isolation layer 110 may be formed using shallow trench isolation (STI).

A cell transistor may be formed in the cell area 101 of the semiconductor substrate 100 and a logic transistor may be formed in the logic area 105 of the semiconductor substrate 100. First gates 120 may be formed on the semiconductor substrate 100 in the cell area 101 and a second gate 125 may be formed on the semiconductor substrate 100 in the logic area 105. The first and second gates 120 and 125 may include a gate insulating layer 121, a gate electrode layer 122 disposed on the gate insulating layer 121, and a gate spacer 124 disposed on a side wall of the gate electrode layer 122. The first and second gates 120 and 125 may further include a silicide layer 123 formed on the gate electrode layer 122.

First impurity regions 126 for source and drain regions may be formed on the active region of both of sides of the first gates 120 in the cell area 101, and second impurity regions 128 for source and drain regions may be formed on the active region of both of sides of the second gate 125 in the cell area 101. Silicide layers (not illustrated) may be formed on parts of the surfaces of the first and second impurity regions 126 and 128.

Figure 2:
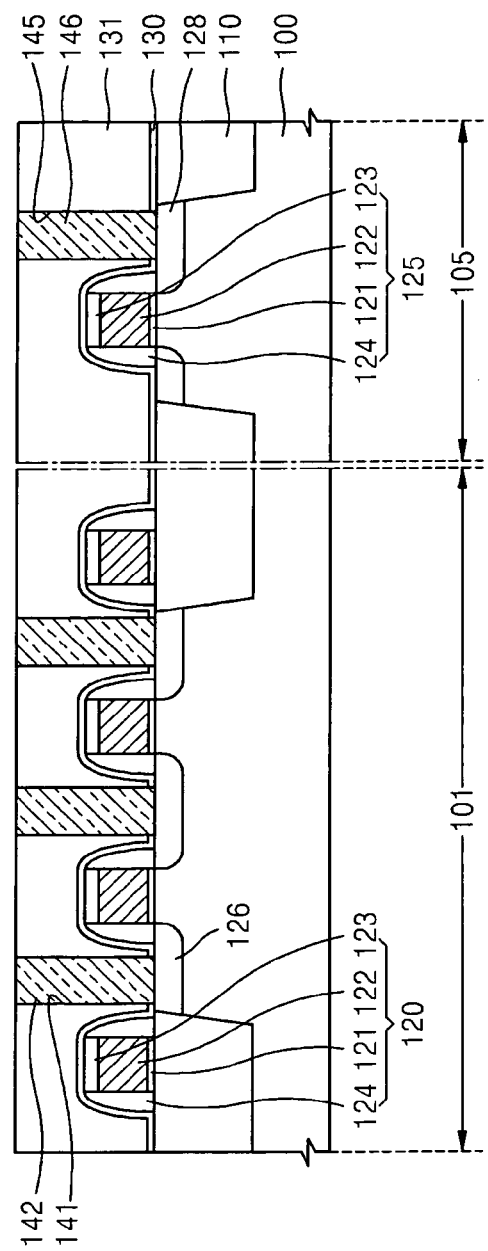

Referring to FIG. 2, a first etching stop layer 130 may be formed on the first and second gates 120 and 125 and the semiconductor substrate 100. The first etch stop layer 130 may include a nitride layer. A first insulating layer 131 may be formed on the first etching stop layer 130. The first insulating layer 131 may include an interlayer insulating layer. The interlayer insulating layer may be formed on the first etching stop layer 130 and may be planarized via chemical mechanical planarization (CMP), thereby forming the first insulating layer 131.

The first insulating layer 131 and the first etching stop layer 130 may be etched to form first contact holes 141 and a second contact hole 145, wherein the first contact holes 141 expose the first impurity regions 126, and the second contact hole 145 exposes one of the second impurity regions 128. A metal film (not illustrated) may be deposited for the first contact holes 141 and the second contact holes 145 to be buried, and the metal film may be etched via CMP until the first insulating layer 131 is exposed. Accordingly, first contact plugs 142 may be formed in the first contact holes 141 and second contact plug 146 may be formed in the second contact hole 145. The first and second contact plugs 142 and 146 may be tungsten plugs.

Referring to FIG. 3, a second insulating layer 132 may be formed on the first and second contact plugs 142 and 146 and the first insulating layer 131. The second insulating layer 132 may be etched to form openings 133 for exposing ones of the first contact plugs 142. The exposed first contact plugs 142 may be in contact with an impurity region corresponding to the source regions in the first impurity regions 126.

Then, a process for forming capacitors electrically connected to the first impurity regions 126 through the exposed first contact plugs 142 may be performed. The capacitor may include a metal-insulator metal (MIM) capacitor. Firstly, a lower electrode layer (not illustrated) may be deposited on the openings 133 and the second insulating layer 132, and the lower electrode layer may be etched to form lower electrodes 151 contacting the exposed first contact plugs 142 in the openings 133 by using a node separation process. The lower electrodes 151 may include a metal nitride film such as tungsten nitride or titanium nitride. Also, the lower electrodes 151 may include a metal layer such as platinum, ruthenium, or iridium.

Referring to FIG. 4, a dielectric material layer 152a may be formed on the second insulating layer 132 and the lower electrodes 151. The dielectric material layer 152a may include a high dielectric material such as $Ta_2O_5$, $Y_2O_3$, HfO, $Nb_2O_5$, $BiTiO_3$, or $SrTiO_3$. An upper electrode layer 153a may be formed on the dielectric material layer 152a so as to fill the openings 133. The upper electrode layer 153a may include a metal nitride layer such as tungsten nitride or titanium nitride. A second etching stop layer 155a may be formed on the upper electrode layer 153a. The second etching stop layer 155a may include a nitride layer. The second etching stop layer 155a may be used as an etching stop layer in a later CMP process.

Referring to FIGS. 5 and 6, a photosensitive layer (not illustrated) is formed on the second etching stop layer 155a. The photosensitive layer may expose a part of the second etching stop layer 155a corresponding to another one of the first contact plugs 142 in the cell area 101 and may expose the entire surface of the second etching stop layer 155a in the logic area 105. The exposed first contact plug 142 may include the contact plug contacting the first impurity region 126 corresponding to the drain region in the first impurity regions 126.

The exposed second etching stop layer 155a, the upper electrode layer 153a, and the dielectric material layer 152a may be sequentially etched using the photosensitive layer as a mask. Accordingly, a dielectric material layer 152, an upper electrode 153, and an etching stop layer pattern 155 including a window 154 may be formed in the cell area 101. In the logic area 105, the second etching stop layer 155a, the upper electrode layer 153a, and the dielectric material layer 152a may be completely removed.

Here, the second insulating layer 132 in the logic area 105 may be etched by a predetermined amount represented by a dotted line after forming of the capacitors. The upper electrode 153 of the capacitor in the cell area 101 may be formed as a front electrode in which the window 154 is disposed in correspondence with a part on which metal plugs for bit lines are to be formed in a later process. The window 154 may expose a part of the second insulating layer 132 corresponding to the first contact plug 142 that contacts the first impurity region 126 corresponding to the drain region.

Referring to FIG. 7, a third insulating layer 134 may be formed on the second insulating layer 132 including capacitors 150 that include the lower electrodes 151, the dielectric material layers 152, and the upper electrodes 153. The third insulating layer 134 may include an interlayer insulating layer. A step difference in the third insulating layer 134 is generated between the cell area 101 and the logic area 105 due to formation of the capacitors 150 in the cell area 101.

Referring to FIG. 8, the third insulating layer 134 may be planarized via CMP. The third insulating layer 134 may be etched until the etching stop layer pattern 155 on the cell area 101 is exposed. In the logic area 105, the third insulating layer 134 is formed on the entire surface of the second insulating layer 132. In the cell area 101, the window 154 is filled in by the insulating layer 134. Accordingly, the step difference between the cell area 101 and the logic area 105 is removed.

Referring to FIGS. 9 and 10, the third insulating layer 134, the second insulating layer 132, and the etching stop layer pattern 155 may be sequentially etched to form a third contact hole 143 and a fourth contact hole 147, wherein the third contact hole 143 exposes another one of the first contact plugs 142 in the cell area 101 and the fourth contact hole 147 exposes the second contact plug 146 in the logic area 105. The third contact hole 143 may be disposed in the window 154. Here, fifth contact holes 157 exposing parts of the upper electrode 153 of the capacitor 150 may be formed.

A metal layer (not illustrated) may be deposited until the third through fifth contact holes 143, 147, and 157 are filled and be etched via CMP until the third insulating layer 134 is exposed. Accordingly, a third contact plug 144 may be formed in the third contact hole 143, a fourth contact plug 148 may be formed in the fourth contact hole 147, and fifth contact plugs 158 may be formed in the fifth contact holes 157. The third through fifth contact plugs 144, 148, and 158 may include tungsten plugs. Since the third contact plug 144 is disposed in the window 154, the third contact plug 144 may be electrically separated from the upper electrode 153.

Figure 11:
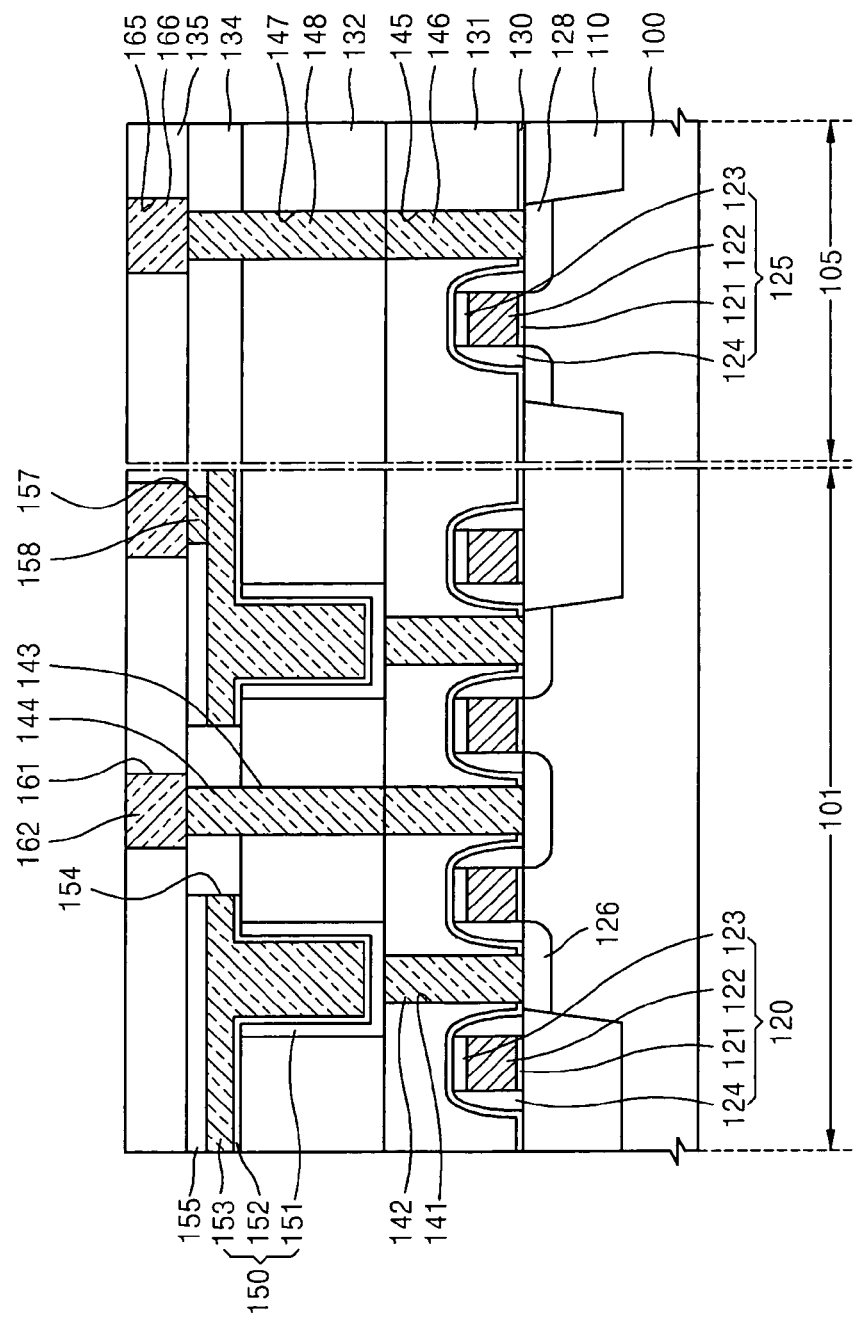
FIGS. 11 through 13 are cross-sectional views illustrating a method of manufacturing a semiconductor device according to an embodiment of the inventive concept.

Referring to FIG. 11, a fourth insulating layer 135 may be formed on the third through fifth contact plugs 144, 148, and 158 and the third insulating layer 134. The fourth insulating layer 135 may include an interlayer insulating layer. The fourth insulating layer 135 may be etched to form first trenches 161 in the cell area 101 and a second trench 165 in the logic area 105, wherein the first trenches 161 expose the third and fifth contact plugs 144 and 158 and the second trench 165 exposes the fourth contact plug 148. A damascene process may be performed to form first and second metal studs 162 and 166 in the first and second trenches 161 and 165, respectively. The first and second metal studs 162 and 166 may include a Cu stud.

Figure 12:
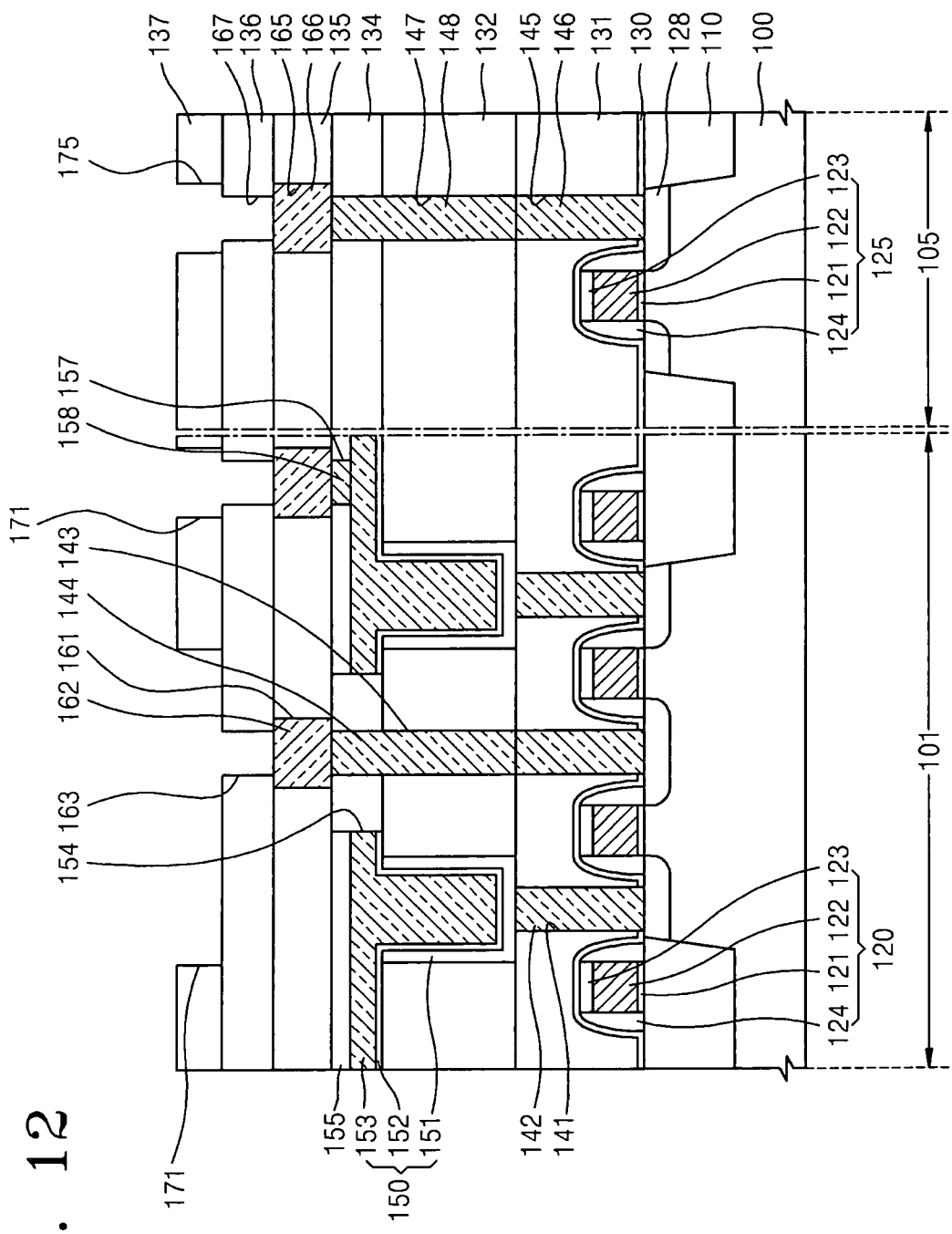

Referring to FIG. 12, a fifth insulating layer 136 may be formed on the first and second metal studs 162 and 166 and the fourth insulating layer 135. The fifth insulating layer 136 may include an interlayer insulating layer. The fifth insulating layer 136 may have a thickness corresponding to height of via holes that are to be formed in a later process. A sixth insulating layer 137 may be formed on the fifth insulating layer 136. The sixth insulating layer 137 may include an interlayer insulating layer. The sixth insulating layer 137 may have a thickness corresponding to height of trenches that are to be formed in a later process.

Then, the fifth and sixth insulating layers 136 and 137 are etched to form first via holes 163 in the cell area 101 and a second via hole 167 in the logic area 105, wherein the first via holes 163 expose parts of the first metal studs 162 and the second via hole 167 exposes a part of the second metal studs 166. The sixth insulating layer 137 may be further etched to form third and fourth trenches 171 and 175 for exposing the first and second via holes 163 and 167. Accordingly, dual damascene patterns including the first and second via holes 163 and 167 and the third and fourth trenches 171 and 175 may be formed.

Figure 13:
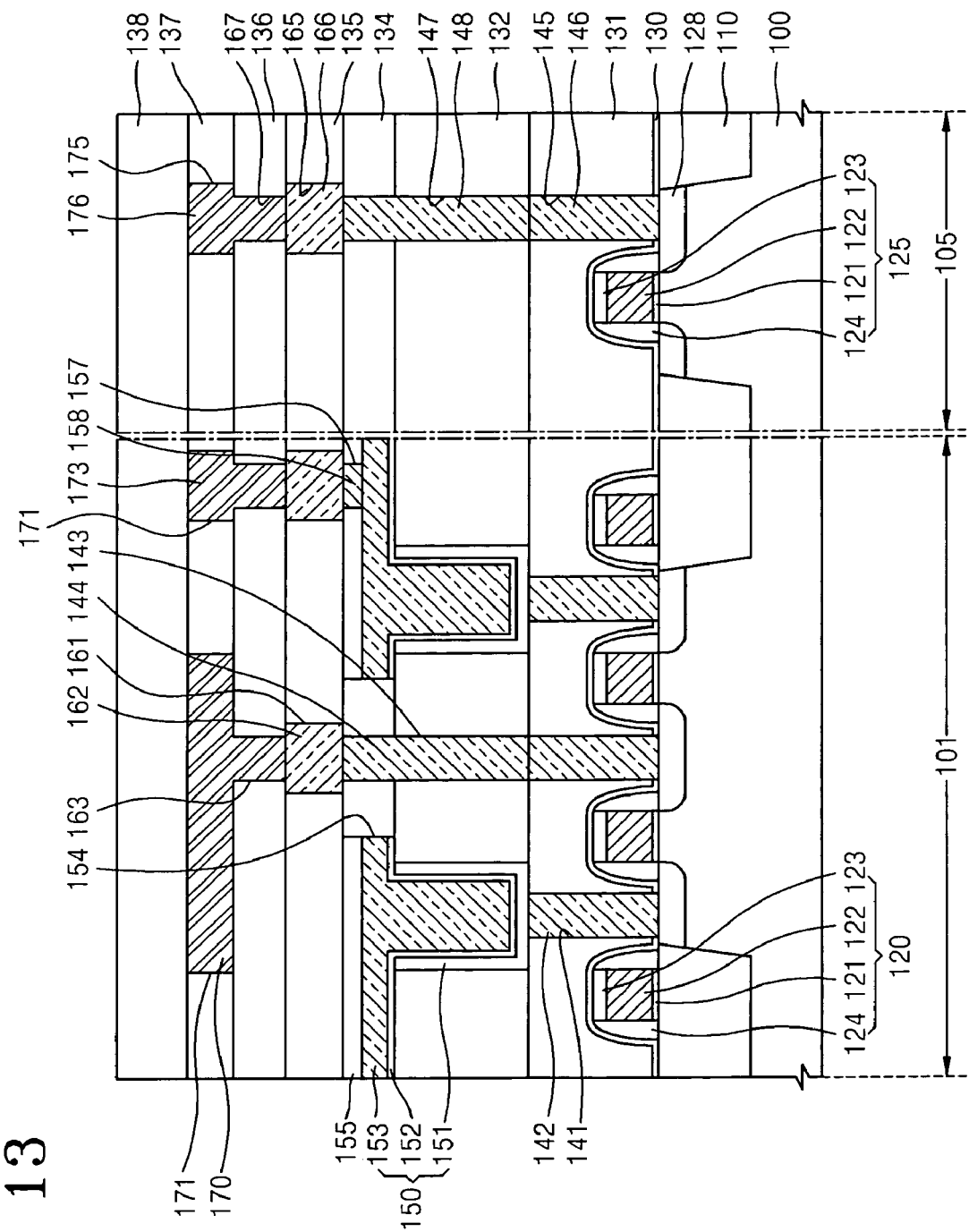

Referring to FIG. 13, a dual damascene process may be performed to form a bit line 170 and a first metal wire 173 in the first via holes 163 and the third trenches 171, respectively, in the cell area 101 and to form a second metal wire 176 in the second via hole 167 and the fourth trench 175 in the logic area 105. The bit line 170 and the first and second metal wires 173 and 176 may include Cu patterns. A seventh insulating layer 138 may be further formed on the sixth insulating layer 137 and may include an interlayer insulating layer.

As another embodiment, a single interlayer insulating layer having a thickness corresponding to the sum total of the heights of the first and second via holes 163 and 167 and the heights of the third and fourth trenches 171 and 175 may be formed and then a dual damascene process may be performed to form the bit line 170 and the first and second metal wires 173 and 176 instead of sequentially forming of the fifth and sixth insulating layers 136 and 137 on the fourth insulating layer 135 and then performing a dual damascene process.

While the inventive concept has been particularly shown and described with reference to exemplary embodiments thereof, it will be understood that various changes in form and details may be made therein without departing from the spirit and scope of the following claims.

What is claimed is:

1. A method of manufacturing a semiconductor device having a capacitor under bit line (CUB) structure, the method comprising:
    forming a first insulating layer on a semiconductor substrate having a cell area and a logic area, the first insulating layer comprising at least two first contact plugs in at least two respective first contact holes, each first contact plug contacting a respective first part of the semiconductor substrate in the cell area and a second contact plug in a second contact hole that contacts a second part of the semiconductor substrate in the logic area;
    forming a second insulating layer on the first insulating layer, the second insulating layer formed to include an opening exposing one of the two first contact plugs;
    forming a capacitor comprising a lower electrode disposed in the opening and contacted with the first contact plug, a dielectric material layer formed on the lower electrode and the second insulating layer in the cell area, and an upper electrode formed on the dielectric material layer;
    forming a third insulating layer on the capacitor and the second insulating layer;
    etching the second and third insulating layers to form a third contact hole in the cell area and to form a fourth contact hole in the logic area;
    forming third and fourth contact plugs in the third and fourth contact holes, respectively;
    forming a fifth contact hole in the third insulating layer and forming a fifth contact plug in the fifth contact hole that contacts the upper electrode of the capacitor;
    forming a fourth insulating layer on the third though fifth contact plugs, the capacitor, and the third insulting layer, wherein first through third conductive studs are disposed in the fourth insulating layer and contact the third through fifth contact plugs; and
    forming a fifth insulating layer on the first through third conductive studs and the fourth insulating layer, wherein a bit line contacted with the first conductive stud, and first and second wires contacted with the second and third conductive studs are at least partially disposed in the fifth insulating layer.

2. The method of claim 1, wherein the forming of the first through third conductive studs comprises:
    etching the fourth insulating layer to form first and second trenches for exposing the first and second contact plugs, and to form a third trench for exposing the part of the upper electrode in the capacitor; and
    forming Cu studs in the first through third trenches using a damascene process.

3. The method of claim 1, wherein the forming of the fifth insulating layer, where the bit line and the first and second wires are disposed, comprises:
    forming a lower interlayer insulating layer on the first through third conductive studs and the fourth insulating layer;
    forming an upper interlayer insulating layer on the lower interlayer insulating layer;
    etching the lower and upper interlayer insulating layers to form via holes for exposing parts of the first through third conductive studs;
    etching the upper interlayer insulating layer to form trenches for exposing the via holes; and
    forming the bit line and the first and second wires disposed in the via holes and the trenches and contacted with the first through third conductive studs using a dual damascene process.

4. The method of claim 1, wherein the forming of the capacitor comprises:
    forming the lower electrode in the opening;
    forming the dielectric material layer on the lower electrode and the first insulating layer;
    forming an upper electrode layer on the dielectric material layer; and
    etching the upper electrode layer and the dielectric material layer to form the dielectric layer and the upper electrode having a window.

5. The method of claim 4, the forming of the capacitor further comprise forming an etching stop layer on the upper electrode layer, wherein the window is formed throughout the etching stop layer, the upper electrode, and the dielectric material layer.

6. The method of claim 5, wherein the etching of the second and third insulating layers further comprises etching a part of the etching stop layer to form the fifth contact hole for exposing the part of the upper electrode and the forming of the third and fourth contact plugs further comprises forming the fifth contact plug in the fifth contact hole for contacting the part of the upper electrode in the capacitor with the third conductive stud.

7. The method of claim 6, wherein the forming of the third insulating layer comprises:

forming a lower interlayer insulating layer on the capacitor and the second insulating layer;

etching the lower interlayer insulating layer until the etching stop layer is exposed to be planarized; and forming an upper interlayer insulating layer on the lower interlayer insulating layer.

8. The method of claim 7, wherein the window is filled in the lower interlayer insulating layer in the cell area and the lower interlayer insulating layer is formed on the entire surface of the logic area.

9. The method of claim 1, wherein the capacitor comprises a metal-insulator metal (MIM) capacitor.

10. A method of manufacturing a semiconductor device having a capacitor under bit line (CUB) structure, the method comprising:

forming a first transistor on a cell area of a semiconductor substrate, the first transistor comprising a first gate and first impurity regions formed on both sides of the first gate, and a second transistor on a logic area of the semiconductor substrate, the second transistor comprising a second gate and second impurity regions formed on both sides of the second gate;

forming a first insulating layer on the semiconductor substrate and the first and second transistors, wherein first contact plugs for exposing parts of the first impurity regions and a second contact plug for exposing one of the second impurity regions are disposed in the first insulating layer;

forming a second insulating layer on the first and second contact plugs and the first insulating layer, the second insulating layer comprising an opening for exposing one of the first contact plugs;

forming a capacitor comprising a lower electrode disposed in the opening and contacted with the exposed first contact plug, a dielectric layer, and an upper electrode formed on the lower electrode and the second insulating layer in the cell area;

forming a third insulating layer on the second insulating layer and the capacitor and removing a step difference between the cell area and the logic area;

etching the second and third insulating layers to form a first contact hole for exposing another one of the first contact plugs in the cell area and to form a second contact hole for exposing the second contact plug in the logic area;

forming third and fourth contact plugs contacted with the exposed first and second contact plugs in the first and second contact holes;

forming a fourth insulating layer on the first and second contact plugs, the capacitor, and the second insulating layer, wherein first through third conductive studs are disposed in the fourth insulating layer and contact the first and second contact plugs and a part of the upper electrode in the capacitor;

forming a fifth insulating layer on the first through third conductive studs and the fourth insulating layer;

etching the fifth insulating layer to form first through third dual damascene patterns for exposing the first through third conductive studs; and forming a bit line and first and second wires contacted with the first through third conductive studs in the first through third dual damascene patterns.

* * * * *